United States Patent [19]
Faulk

[11] Patent Number: 5,786,687
[45] Date of Patent: Jul. 28, 1998

[54] TRANSFORMER-ISOLATED PULSE DRIVE CIRCUIT

[75] Inventor: Richard A. Faulk, Cypress, Tex.

[73] Assignee: Compaq Computer Corporation, Houston, Tex.

[21] Appl. No.: 753,928

[22] Filed: Dec. 3, 1996

[51] Int. Cl.$^6$ .................................................. G05F 1/575
[52] U.S. Cl. .................................... 323/289; 323/351
[58] Field of Search .................................. 323/282, 289, 323/290, 351; 363/20, 21, 41, 97

[56] References Cited

U.S. PATENT DOCUMENTS

| | | | |
|---|---|---|---|
| 3,805,094 | 4/1974 | Orlando | 323/289 |
| 4,349,752 | 9/1982 | Forte | 323/289 |
| 4,443,719 | 4/1984 | Planer et al. | 363/60 |
| 4,634,903 | 1/1987 | Montorfano | 323/290 |
| 4,937,722 | 6/1990 | Deierlein | 323/290 |
| 4,947,311 | 8/1990 | Peterson | 323/282 |
| 4,967,101 | 10/1990 | Nakamura et al. | 323/289 |
| 5,138,515 | 8/1992 | Bourgeois | 323/289 |

*Primary Examiner*—Jeffrey L. Sterrett
*Attorney, Agent, or Firm*—Robert Groover; Betty Formby; Matthew S. Anderson

[57] ABSTRACT

In a computer having switch-mode power converter, a pulse transformer circuit drives the converter's transistor switch in response to pulses from a switch control pulse source. A primary capacitor is connected in series with the switch control pulse source and the transformer's primary winding. At the leading edge of a switch control pulse, the primary capacitor causes a positive voltage spike to appear across the primary winding and hence a positive voltage spike to be induced across the transformer's secondary winding. At the trailing edge of the switch control pulse, the primary capacitor causes a negative voltage spike to appear across the primary winding and hence a negative voltage spike to be induced across the transformer's secondary winding. The induced positive voltage spike causes a driver to activate the transistor switch and maintain the activation of the transistor switch until an induced negative voltage spike, and the induced negative voltage spike causes the driver to discharge the transistor switch.

20 Claims, 4 Drawing Sheets

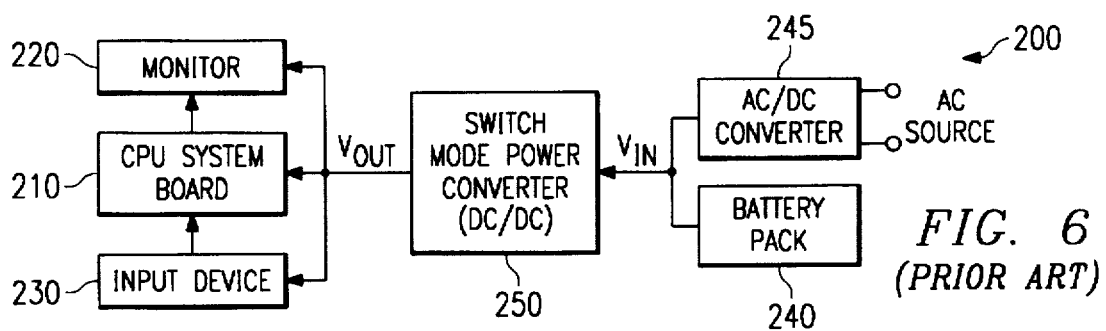
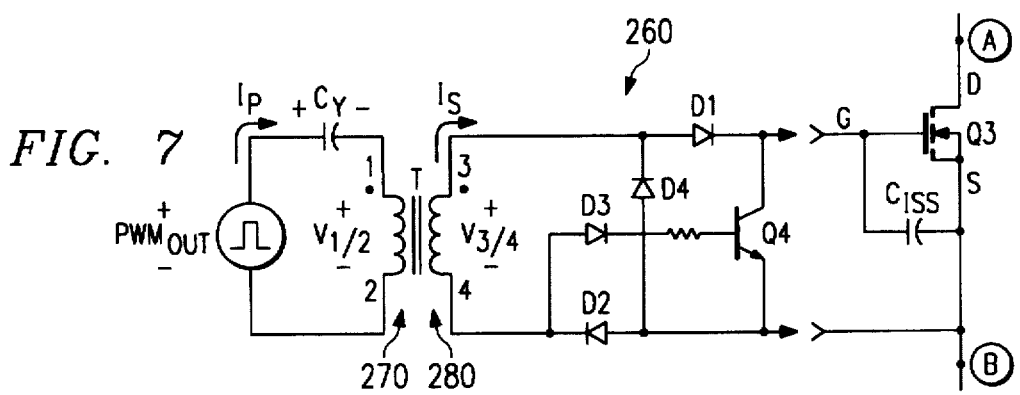
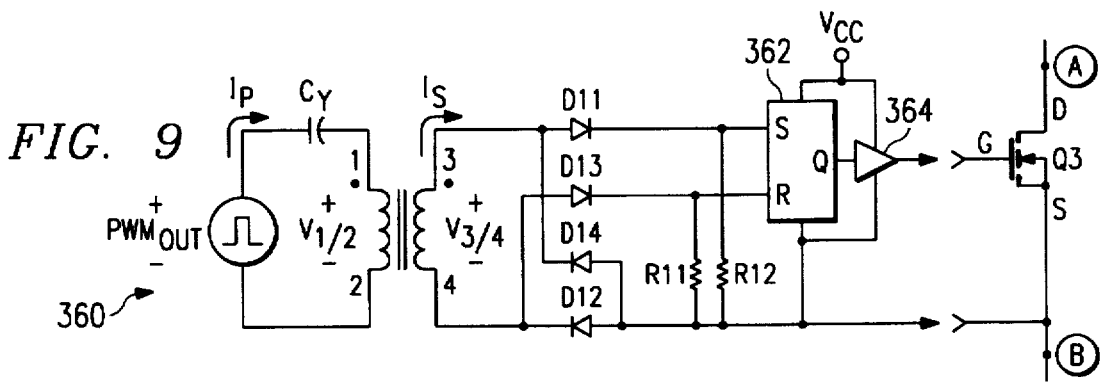
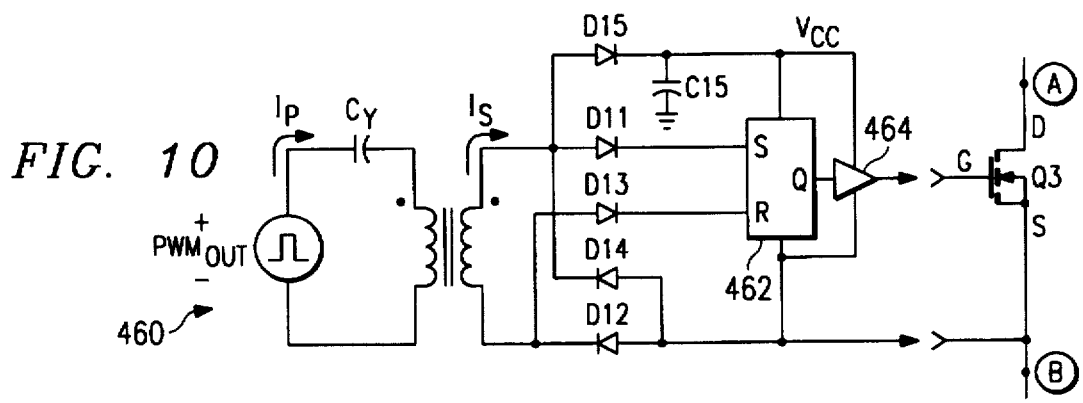

TRANSFORMER-ISOLATED PULSE DRIVE CIRCUIT

BACKGROUND

The invention relates to computers that use a switch-mode power converter.

A typical switch-mode power converter receives an unregulated DC signal, steps down the voltage, and delivers a regulated DC signal to a load. Voltage regulation of the load is achieved with regulation circuitry that produces a feedback signal. The feedback signal is generally proportional to the load level and compensates for changes in the load voltage level. The feedback signal is received, typically, by a pulse width modulator (PWM). The PWM produces switch control pulses of constant frequency and of a width that varies in response to the feedback signal. Switch control pulses are used to alter the time the switch is activated, thus pumping either more or less energy into the converter and hence to the load. As the feedback signal indicates a reduction in the load level, the PWM generates switch control pulses of a smaller width, thus causing less energy to be pumped into the converter and delivered to the load, thereby maintaining the load voltage at the regulated level.

The switch used in switch-mode power converters is typically a transistor. It may be a unipolar device, such as a field-effect transistor (FET), or a bipolar device. Gate drive circuitry receives switch control pulses from the PWM and, in response to the pulses, produces an output that drives, or activates, the transistor switch.

Various configurations of gate drive circuitry are known. In FIG. 1, a Buck-type switch-mode power converter 10 receives an unregulated DC signal $V_{IN}$ of 20 volts and produces a regulated output DC signal $V_{OUT}$ of 5 volts. The power converter 10 employs an n-channel FET Q1 as the switch device. FET Q1 is driven by gate drive circuitry 20. Gate drive circuitry 20 produces, in response to switch control pulses $PWM_{OUT}$ of constant frequency (for example, 100 kHz) and variable pulse width, the required gate-to-source voltage $V_{G/S}$ to activate FET Q1 only during the "on" time of the pulse. Gate drive circuitry 20, simply applying the required gate-to-source drive voltage, will not hold FET Q1 on, however, because turning the FET Q1 on causes voltage from $V_{IN}$ to appear at the source of the FET Q1. Therefore, gate drive circuitry 20 must apply a voltage to the gate of the FET Q1 that is equal to the FET's required gate-to-source voltage $V_{G/S}$ plus $V_{IN}$.

In FIG. 2, power converter 30 employs, instead of an n-channel FET as in the case of FIG. 1, a p-channel FET Q2 driven by gate drive circuitry 40 that pulls the FET's gate voltage to ground to produce the negative gate-to-source voltage $V_{G/s}$ needed to activate FET Q2. The FET Q2's source must be connected to $V_{IN}$ though, thus requiring a voltage of $V_{IN}$ to be maintained at the gate to maintain FET Q2 in the off state. Therefore, the use of the p-channel FET configuration has limited application, depending on the value of $V_{IN}$ and the voltage limit that the p-channel FET's gate is able to handle. In addition, p-channel FETs are less desirable than n-channel devices because of their higher cost and slower switching speeds.

Switch-mode power converters may be used where operating voltages are elevated above normal operating voltages. Examples include telecommunications uses where the operating voltage may be elevated 40 Volts and off-line uses (for example, in portable, laptop computers) where the operating voltage may be elevated anywhere from 100 to 400 Volts. In these applications, gate drive circuit X60 that employs a transformer T, as shown in FIG. 3, has been used to isolate the gate drive voltage from $V_{IN}$. Transformer-isolated gate drivers have traditionally been much larger, physically, than non-isolated gate drivers, but can operate at higher switching speeds.

One particular prior art transformer-isolated gate drive circuit 160, shown in FIG. 4, (for use, for example, as circuitry X60 in FIG. 3) receives switch control pulses (PWMOUT). The pulses (for example, at 100 kHz) are provided in series with a capacitor $C_X$ and the transformer's primary winding 170. Capacitor $C_X$ is sized, for example, 0.250 µF, to charge and discharge very slightly from an average $PWM_{OUT}$ level. Thus, if the $PWM_{MAX}$ is 10 Volts and the duty cycle δ is 0.50, then the voltage across $C_X$ will hover around 5 Volts, as shown in the timing diagram of FIG. 5. Thus, a square-wave signal centered about a ground voltage is applied to the transformer's primary winding 170. This induces a similar signal $V_{3/4}$ across the secondary winding 180. The induced positive $V_{3/4}$ together with the voltage $V_7$ across $C_2$ provides the voltage $V_{G/S}$ that activates the FET Q3.

As seen in FIG. 5, the voltage of the switch control pulse continues to cause a positive induced voltage $V_{3/4}$ throughout the entire period of the switch control pulse. Therefore, the FET Q3 is continuously driven throughout the entire period. When the switch control pulse ends, a positive voltage is no longer induced in the secondary 180, and FET Q3 consequently turns off.

A FET of the type used as Q3 (FIG. 4) has an inherent capacitor $C_{ISS}$. Capacitor $C_{ISS}$ charges to 10 Volts as the FET Q3 is being driven. Resistor R is therefore used to discharge the voltage across $C_{ISS}$ when the switch control pulse ends. Thus, when the switch control pulse ends, the FET Q3 does not continue to be driven by $C_{ISS}$.

During the entire time the FET Q3 is being driven and a positive voltage is being induced in the secondary winding 180, the required magnetizing current ($I_M$) increases linearly. Magnetizing current is the primary current $I_p$, required by the transformer T to maintain the transformer's operation and continue inducing in the secondary winding 180 the needed driving voltage. At the same time that the magnetizing current $I_M$ is increasing linearly, magnetic flux (φ) is also increasing linearly.

An inherent property of transformers is a magnetic flux density B limit. When the magnetic flux density of the transformer T core material reaches this limit (that is, when the point of magnetic saturation is reached), transformer T ceases to operate as a transformer and an induced voltage necessary for driving FET Q3 will no longer be produced. Therefore, in the prior art design of FIG. 4, it was necessary to make the transformer large enough physically to prevent magnetic saturation from occurring. This relationship between B and transformer size is governed by the following equation:

$$B = \frac{\int v_{1/2} dt}{NA} \cdot 10^8; \quad NA = \frac{\int v_{1/2} dt}{B} \cdot 10^8$$

where $v_{1/2}$ is the voltage across the transformer's primary winding 170, N is the number of turns in the primary winding 170, and A is the cross-sectional area of the transformer's core. Thus, in the prior art example of FIG. 4, and looking specifically at the period a switch control pulse is being applied, we have the following equation:

$$NA = \frac{V_{MAX} \cdot T_{ON/MAX}}{B} \cdot 10^8$$

where $V_{MAX}$ is the amplitude of $V_{1/2}$ in a maximum power condition, and $T_{ON/MAX}$ is the period of switch control pulses in the maximum power condition. Because of the transformer size design constraint illustrated in the above equations, transformer-isolated gate drivers have consequently been bulky and expensive.

Also, because magnetizing current Im is continually increasing during the entire period that voltage is applied across the primary winding 170, a significant amount of power is being generated in the transformer T. This power is governed by the following equation:

$$POWER = I_M^2 \cdot L_M \cdot \tfrac{1}{2} f$$

where $L_M$ is the magnetizing inductance in the primary winding 170, and Im is the magnetizing current. Magnetizing inductance $L_M$ is governed by the following equation:

$$L_M = N^2 \cdot \mu \cdot A / l$$

where N is the number of turns in the primary winding 170, $\mu$ is the permeability for the transformer T core material, A is the cross-sectional area, and l is the length of the magnetic circuit. The magnetizing inductance $L_M$ is thus constant for a given transformer. Magnetizing current $I_M$ is governed by the following equation:

$$I_M = \frac{\int v_{1/2} dt}{L_M}$$

and in the prior art example of FIG. 4, by the following equation:

$$I_M = \frac{(V_{MAX} \cdot T_{ON/MAX})}{L_M}$$

Thus, the power being generated in the transformer in the prior art example is governed by the following equation:

$$POWER = \frac{1}{2} \cdot \frac{(V_{MAX} \cdot T_{ON/MAX})^2}{L_M \cdot f}$$

This power, being generated in the transformer, has either been dissipated, or with additional circuitry, it has been recirculated and used to some extent. In addition, power losses in the transformer core generally are proportional, though not linearly, with the cross-sectional area of the core.

The general object of the invention is to provide a transformer-isolated driver circuit of reduced size, which generates less power in the transformer, and which reduces transformer losses.

SUMMARY OF THE INVENTION

In general, the invention features a circuit for driving a transistor switch in a switch-mode power converter that may be used, for example, in a portable personal computer. The transistor switch is driven in response to pulses generated by a switch control pulse source. The pulse gate driving circuit includes a transformer and a primary capacitor. The switch control pulse source and the primary capacitor are connected in series with the transformer's primary winding. At the leading edge of a switch control pulse, the primary capacitor causes a positive voltage spike (i.e., a relatively short-duration positive pulse) to appear across the primary winding and hence a positive voltage spike to be induced across the transformer's secondary winding. At the trailing edge of a switch control pulse, the primary capacitor causes a negative voltage spike (i.e., a relatively short-duration negative pulse) to appear across the primary winding and hence a negative voltage spike to be induced across the transformer's secondary winding. A driver activates the transistor switch. The induced positive voltage spike causes the driver to activate the transistor switch, and the induced negative voltage spike causes the driver to discharge the transistor switch.

In one embodiment, the driver includes a driving capacitor, which may be the inherent capacitor of the transistor switch, in circuit configuration with the transistor switch. The driving capacitor is charged by the induced positive voltage spike, and the capacitor so charged continues the activation of the transistor switch after the positive voltage spike has ended. Another transistor switch, which is activated by the induced negative voltage spike, allows the driving capacitor to discharge the transistor switch.

In other embodiments, the driver includes an S-R latch having an output operably connected to the transistor switch. The S-R latch receives at its set input the induced positive voltage spike, and in response, causes the latch's output to go high. At its reset input, the S-R latch receives the induced negative voltage spike, and in response, causes the latch's output to go low. The transistor switch is driven in response to the high latch output. The S-R latch may be a CMOS device, and may be powered by a source outside from the driver circuit. Alternatively, the S-R latch may be powered by voltage derived from the switch control pulses.

The switch may be a field effect transistor, or alternatively, a bipolar switch device. The pulse driving circuit may be used in conjunction with a Buck-type switch-mode power converter used in personal computer applications. Also, the pulse driving circuit may be used to drive a field effect transistor used as a synchronous rectifier.

Among the advantages of the invention may be one or more of the following. Because the magnetic flux in the transformer is not being allowed to continuously increase during the entire period the switch control pulse, the transformer may be smaller and consequently less expensive and there will be lower power losses in the transformer core. Also, because magnetizing current is not building up in the transformer during the entire period of the switch control pulse, power is being conserved.

Other advantages and features will become apparent from the following description and from the claims.

BRIEF DESCRIPTION OF THE DRAWINGS

FIG. 6 is a block diagram in accordance with the invention.

FIG. 7 is a schematic diagram according to an embodiment of the invention.

FIG. 9 is a schematic diagram of a second embodiment of the invention.

FIG. 10 is a schematic diagram of a third embodiment of the invention.

DETAILED DESCRIPTION OF THE INVENTION

Figure 1:
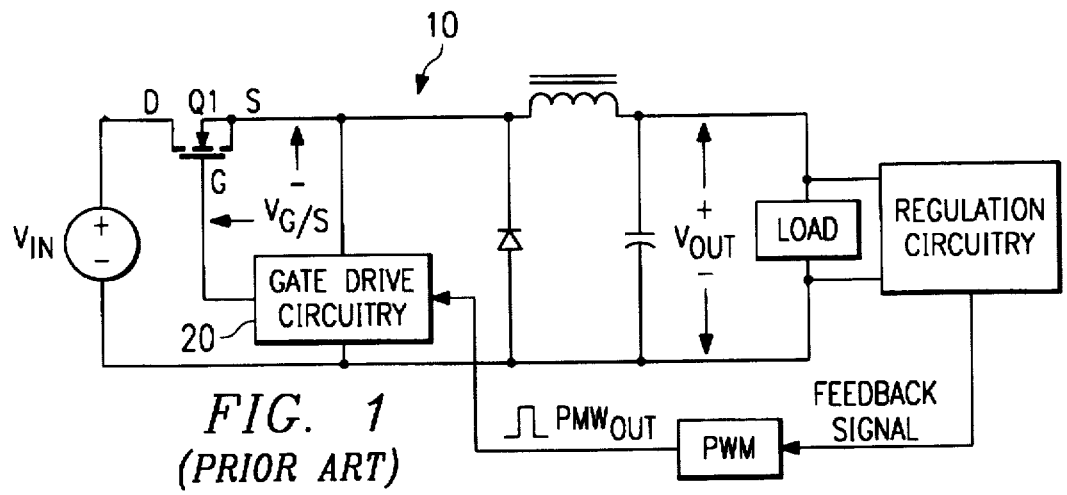
FIG. 1 is a partial schematic, partial block diagram of a prior art circuit.
Figure 2:
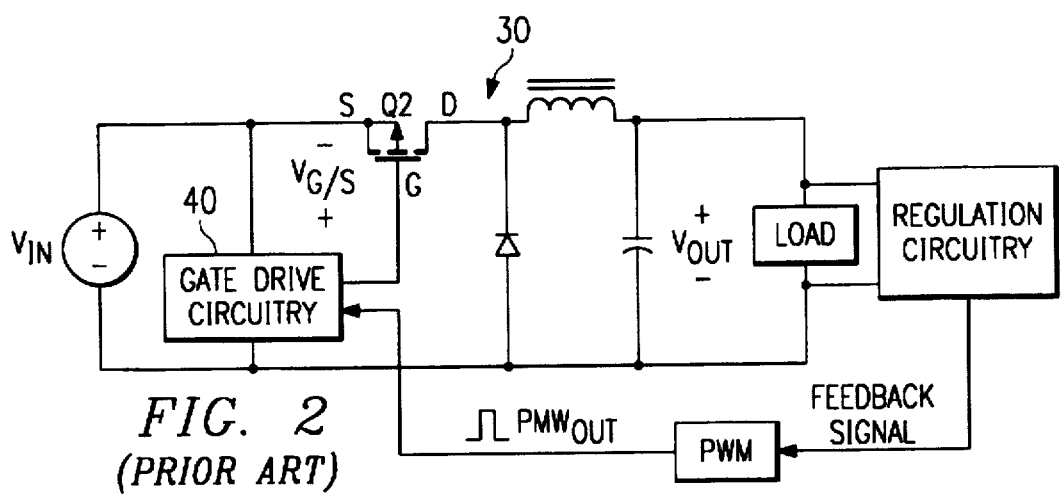
FIG. 2 is a partial schematic, partial block diagram of a prior art circuit.

A portable personal computer 200, shown in FIG. 6, incorporates the invention and includes a CPU system board 210 that is in communication with a display device (for example, a monitor 220) and an input device 230 (for example, a keyboard and mouse). The portable computer 200 is adaptable to be powered either by an external AC power source (for example, a 110 Volt, 60 Hz AC signal available in most homes in the United States), or by a self-contained battery pack 240. An unregulated DC voltage $V_{IN}$ is produced by either an AC/DC converter 245 or the battery pack 240. A switch-mode power converter 250 receives the unregulated DC signal $V_{IN}$ and generates a voltage-regulated DC signal $V_{OUT}$, which provides the power source for the CPU system board 210, the monitor 220, and the input device 230.

In one application, the unregulated DC signal $V_{IN}$ has a peak voltage of 20 Volts and the switch-mode power converter 250 produces a voltage-regulated output voltage $V_{OUT}$ of 5 Volts. The switch-mode power converter 250 is a Buck-type converter, such as the converter 50 shown in FIG. 3, which uses an n-channel FET Q3 as its switch device. The FET Q3, in this embodiment, is activated with a 10-Volt gate-to-source voltage $V_{G/S}$.

Figure 3:
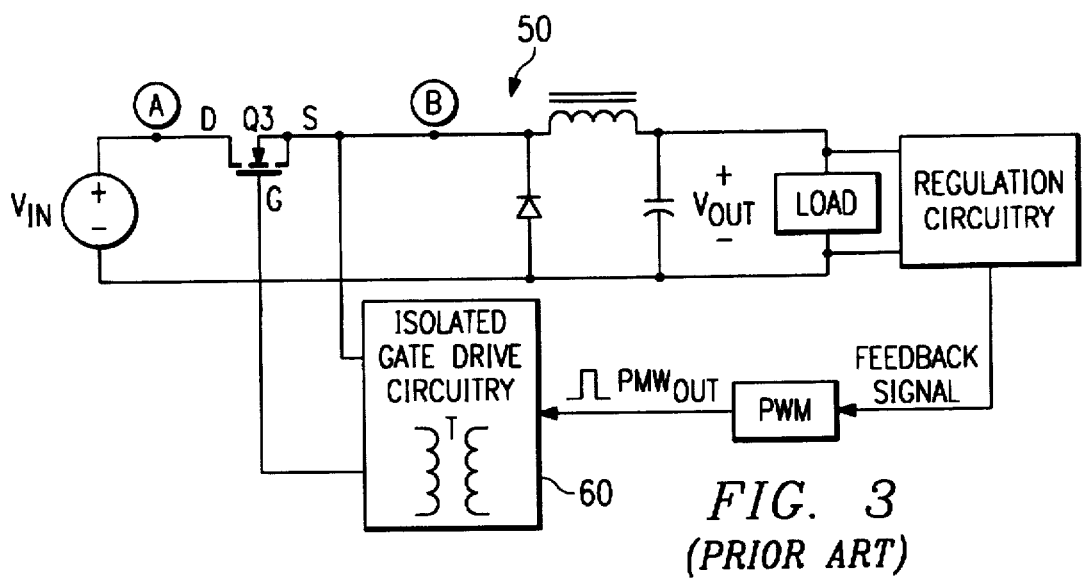
FIG. 3 is a partial schematic, partial block diagram of a circuit to which either a prior art circuit or a circuit of the present invention may apply.
Figure 4:
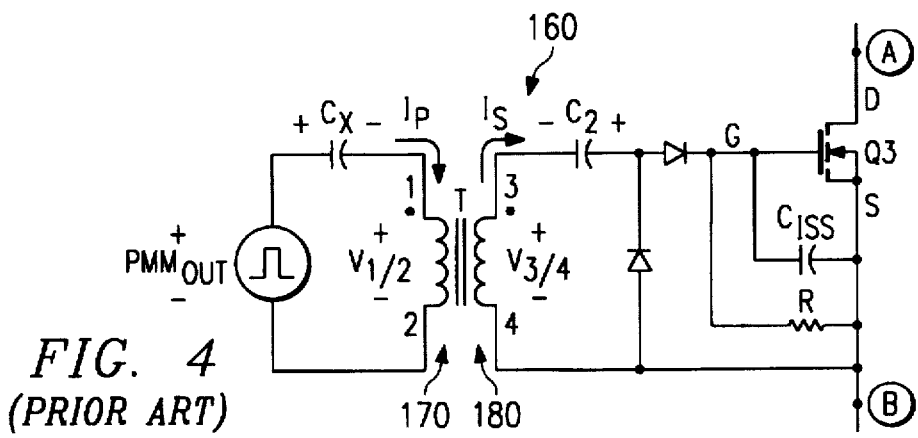
FIG. 4 is a schematic diagram of a prior art circuit.
Figure 5:
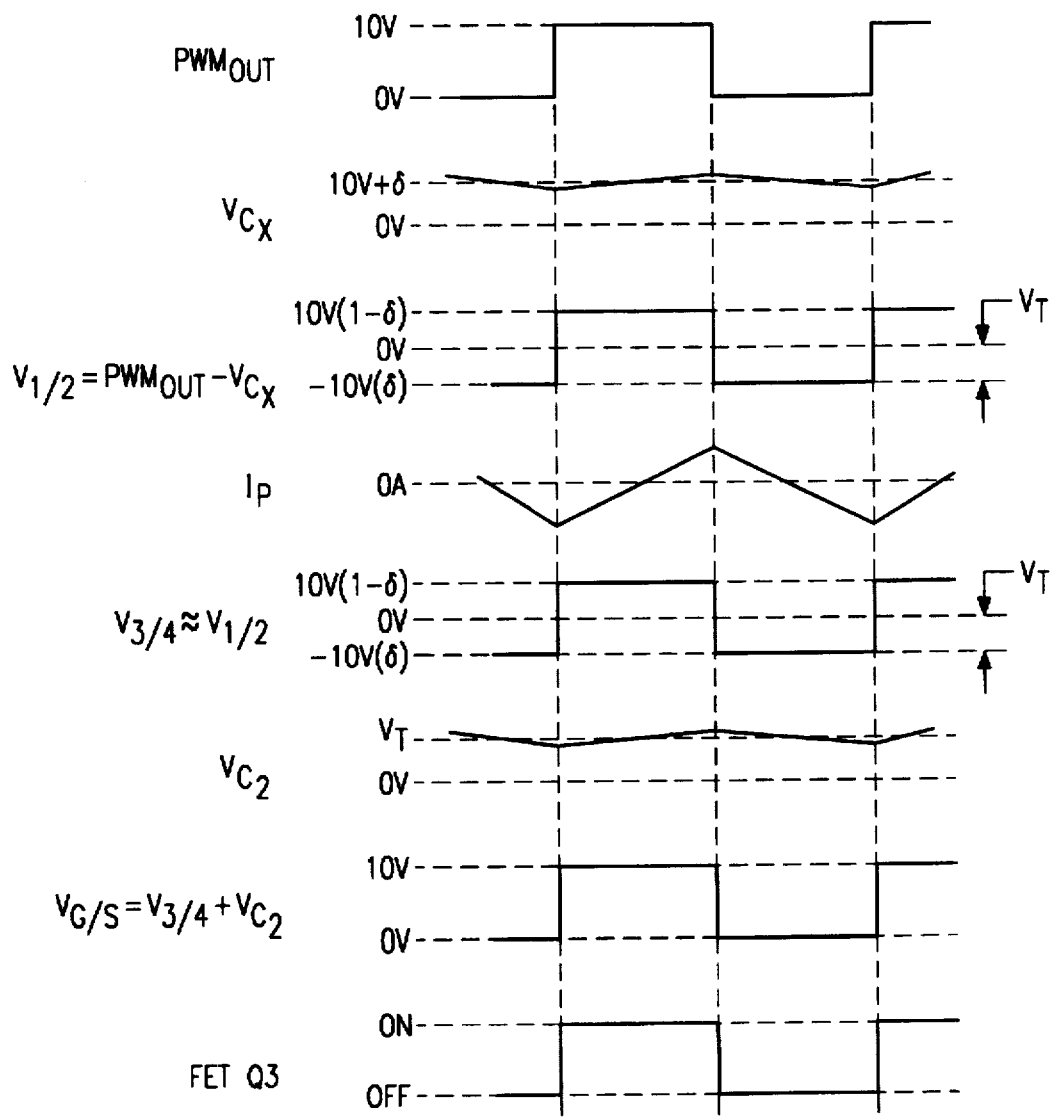
FIG. 5 shows timing diagrams for the prior art circuit of FIG. 4.

For driving the n-channel FET Q3, an improved transformer-isolated pulse gate drive circuit 260, shown in FIG. 7, is used as the gate drive circuit X60 shown in FIG. 3. Pulse gate drive circuit 260 receives switch control pulses $PWM_{OUT}$ which have a 10 Volt amplitude, a constant frequency (for example, 100 kHz) and a variable pulse width. (See FIG. 8.) Pulse gate drive circuit 260 employs a capacitor $C_Y$ which is much smaller than capacitor $C_X$ used in the prior art gate drive circuit 160 (FIG. 4). For example, a capacitor of 0.004 μF is used in circuit 260, as compared with the 0.250 μF capacitor used in circuit 160. Before a $PWM_{OUT}$ pulse is received by circuit 260, capacitor $C_Y$ is in an uncharged state (see FIG. 8). When a $PWM_{OUT}$ pulse is received, capacitor $C_Y$ charges to the 10-volt level, and, owing to the relatively small capacitance value of $C_Y$, the charging of capacitor $C_Y$ occurs very quickly.

Figure 8:
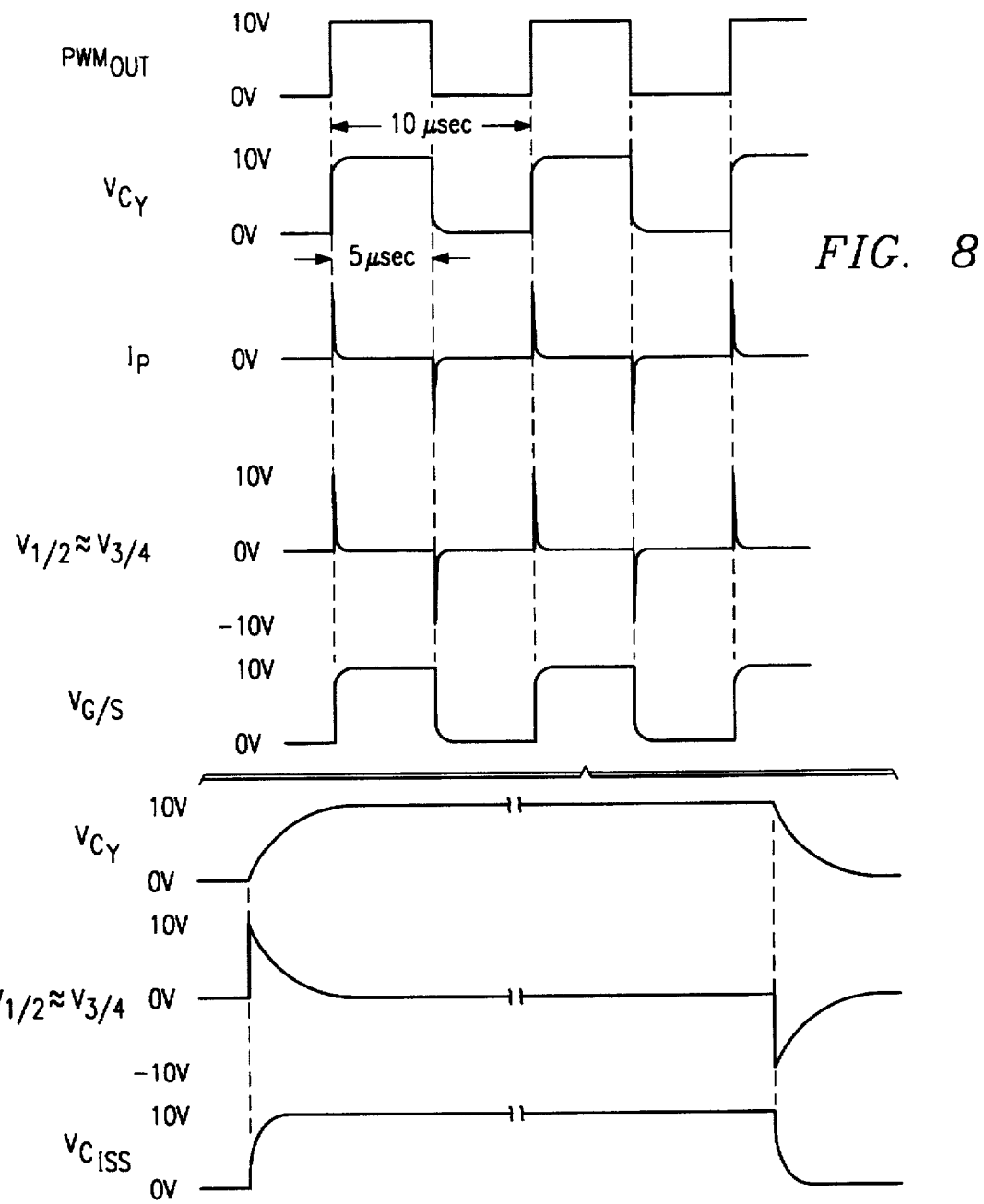
FIG. 8 shows timing diagrams for the embodiment of FIG. 7.

Prior to capacitor $C_Y$ charging to the 10 volt level, a voltage $V_{1/2}$ appears across primary winding 270 of transformer T, as shown in FIG. 8. The $V_{1/2}$ positive voltage spike generated at the beginning of each $PWM_{OUT}$ pulse induces a similar positive voltage spike $V_{3/4}$ across the transformer's secondary winding 280. The turns ratio of the transformer is typically 1-to-1, and hence the induced voltage $V_{3/4}$ is approximately 10 Volts. The 10-Volt induced voltage $V_{3/4}$ causes a 10-Volt $V_{G/S}$ voltage and hence turns "on" FET Q3, although after the FET Q3's 25-nanosecond turn-on time delay.

The induced voltage $V_{3/4}$ generated at the beginning of each $PWM_{OUT}$ pulse also charges the inherent capacitor $C_{ISS}$ of FET Q3. The inherent capacitor $C_{ISS}$ will typically be about 400 picoFarads, measured as effective capacitance. Because capacitor $C_{IIS}$ has a smaller capacitance value than capacitor $C_Y$ (by a 10-to-1 ratio), $C_{ISS}$ charges to 10 Volts faster than $C_Y$ does and, importantly, before capacitor $C_Y$ charges and blocks the appearance of a voltage $V_{1/2}$ across primary winding 270.

When capacitor $C_Y$ charges to the point where induced voltage $V_{3/4}$ is no longer sufficient, by itself, to drive FET Q3, FET will continue to be driven by the voltage across capacitor $C_{ISS}$. Unlike prior art circuit 160, circuit 260 does not have a resistor R3 for discharging the capacitor $C_{ISS}$ charge when a secondary voltage $V_{3/4}$ sufficient for driving FET Q3 is no longer provided. In addition, the capacitor $C_{ISS}$ is not able to discharge elsewhere, given diode D1's orientation and the fact that transistor switch Q4 is at this time off.

Thereafter, at the end of the $PWM_{OUT}$ pulse (that is, when $PWM_{OUT}$ drops back to 0 volts), and due to the fact that capacitor $C_Y$ is at that time charged to 10 volts, a $V_{1/2}$ negative voltage spike appears across primary winding 270. Thus, in the secondary winding a negative voltage $V_{3/4}$ is induced. Current thus travels through diode D3 creating a base-to-emitter voltage in transistor Q4, thus turning transistor Q4 on. With transistor Q4 on, the charge on FET Q3's inherent capacitor $C_{ISS}$ discharges through transistor Q4. Therefore, at the end of the $PWM_{OUT}$ pulse, the FET Q3 is discharged, or turned off.

With circuit 260, a magnetizing current $I_M$ does not build up over the entire period of the switch control pulse, in contrast to the prior art circuit 160 (FIG. 4). A magnetizing current is only needed for the brief period prior to FET Q3 turning on and $C_{ISS}$ charging to the driving voltage. Also, because once $C_{ISS}$ is charged the transformer T is no longer needed, the transformer T thereafter may be driven to magnetic saturation and performance will not be affected.

Advantages of the invention are readily understood with reference to the transformer size equation and power equation discussed above. As an example, suppose the frequency of switch control pulses is 100 kHz and the maximum duty cycle is 50%. In this case, the $V_{MAX}$ would be approximately 5 Volts and $T_{ON/MAX}$ would be 5 μSec ($5 \times 10^{-6}$ Sec). With the circuit of the present invention, it is only necessary to apply a 10-Volt spike of, for example, 50 nanoSec ($5 \times 10^{-8}$ seconds) to the transformer primary winding to turn on the transistor Q3 and charge $C_{ISS}$ to 10 Volts. Substituting these values in the turns-area (N·A) equation above, it is seen that the invention provides roughly a 50-fold decrease in the required transformer turns-area product.

An example of a transformer used in connection with the invention is of a toroid configuration and has an outside diameter of about 0.14" and a height of about 0.05". On a circuit board, this transformer thus takes up a volume of about 0.000980 cubic inches. An example of a prior art transformer, used for example in connection with the circuit 160 of FIG. 4, takes up a volume on a circuit board that is approximately 0.30" by 0.30" by 0.30", which is a total volume of about 0.027 cubic inches. Therefore, the decrease in size of the transformer made possible by the invention may be approximately 28-fold.

Likewise, there is roughly a 50-fold decrease in the numerator of the magnetizing current $I_M$ equation and a 2,500-fold decrease in the numerator of the POWER equation. However, because the transformer is smaller as discussed above, the magnetizing inductance $L_M$ is smaller and hence the denominators of the magnetizing inductance $L_M$ and POWER equations are also reduced. The magnetizing inductance $L_M$ is reduced much less than 2,500-fold. The power generated in the transformer is reduced, with a significant reduction in the power that must be dissipated or otherwise dealt with.

A second and a third embodiment of the transformer-isolated pulse gate drive circuit 360 and 460 of the present invention, shown in FIGS. 9 and 10, respectively, use an S-R flip-flop 362 and 462 and an amplifier 364 and 464, respectively. In response to the brief initial induced $V_{3/4}$ positive voltage spike, which is received at the set input S of the flip-flop, an output Q goes high which, after it is amplified, drives FET Q3. As in the first embodiment, FET Q3 continues to be driven even after the induced voltage $V_{3/4}$ is no longer sufficient, by itself, to drive FET Q3, although the continued driving in the second and third embodiments is by virtue of the S-R flip-flop 362 and 462. Thereafter, the negative $V_{3/4}$ voltage spike induced at the end of the switch control pulse causes a signal to be received at the reset input R of flip-flop 362 and 462, thereby resetting flip-flop output Q and causing the FET Q3 to turn off.

The difference between circuit 360 and circuit 460 is that circuit 360 (FIG. 9), because of its physical placement, has available a stable, outside source for $V_{CC}$. For example, the stable, outside $V_{CC}$ source may be the regulated voltage $V_{OUT}$ which is available in flyback-type power converter applications (see FIG. 11). With the stable, outside $V_{CC}$ source, circuit 360 does not require a low-power CMOS flip-flop as flip-flop 362. However, because of the capacitive inputs on higher-power CMOS flip-flop devices, resistors R11 and R12 may also be necessary to provide the necessary impedance to drain the capacitance. Circuit 460 (FIG. 10), on the other hand, does not have a stable, outside $V_{CC}$ source available, and instead is powered by the induced positive voltage spike $V_{3/4}$. Therefore, a very low-power CMOS flip-flop is desirable.

Figure 11:
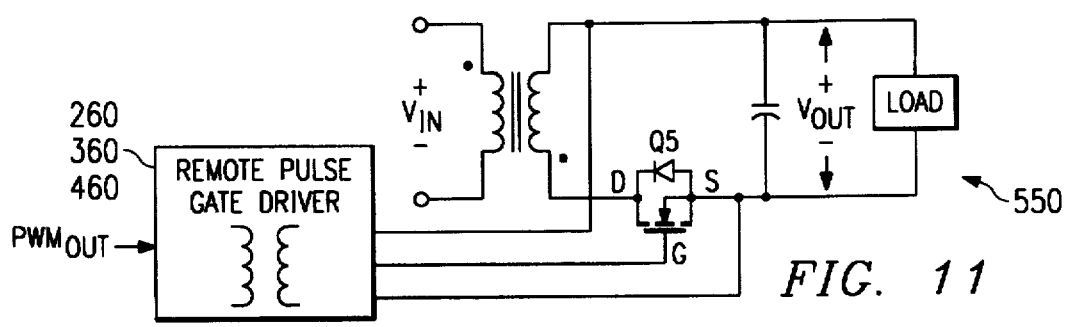
FIG. 11 is a diagram, partially schematic and partially block, of a circuit embodying aspects of the invention.

FIG. 11 shows how the remote pulse gate driver of the present invention may be used in a synchronous rectifier application. A switch-mode power converter 550 of the flyback type, shown in FIG. 11, uses MOSFET Q5 and any one of the transformer-isolated pulse gate driver circuits (260, 360 or 460). In this application, MOSFET Q5's internal diode is put to use. MOSFET Q5 thus operates as a synchronous rectifier, which eliminates the need for rectifying diodes in the converter 550. Although active rectification with a MOSFET Q5 may be more costly than passive rectification with a diode, it is desirable to use active rectification in some applications because the elimination of rectifying diodes saves space.

Other embodiments are within the scope of the claims. What is claimed is:

1. A switch-mode power converter comprising:
   a transistor switch; and
   a pulse transformer circuit for driving the transistor switch in response to a stream of switch control pulses, the pulse transformer circuit comprising:
      a transformer having a primary winding and a secondary winding;
      a primary capacitor;
      the switch control pulse source and the primary capacitor connected in series with the primary winding, wherein the primary capacitor is sized so that beginning at the leading edge of a switch control pulse, a positive voltage spike is applied across the primary winding inducing a positive voltage spike across the secondary winding, and, beginning at the trailing edge of a switch control pulse, a negative voltage spike is applied across the primary winding inducing a negative voltage spike across the secondary winding; and
      a driver operatively connected to the secondary winding and the transistor switch, the driver activating the transistor switch in response to the induced positive voltage spike across the secondary winding and discharging the transistor switch through a bipolar discharging transistor in response to the induced negative voltage spike across the secondary winding.

2. The switch-mode power converter of claim 1 wherein the transistor switch is a field effect transistor.

3. The switch-mode power converter of claim 1 wherein the primary capacitor has a capacitance value of about 0.004 microFarads.

4. The switch-mode power converter of claim 1 wherein the driver comprises:
   a driving capacitor connected to the transistor switch, wherein the capacitor is charged by the induced positive voltage spike and remains sufficiently charged after the induced positive voltage spike has ended to maintain the activation of the transistor switch until the appearance of the induced negative voltage spike; and
   means for discharging the driving capacitor to deactivate the transistor switch, the discharging means being activated in response to the induced negative voltage spike.

5. The switch-mode power converter of claim 4 further comprising a diode network operatively connected to the secondary winding, the transistor switch, the driving capacitor and the discharging means, wherein the diode network directs positive induced voltage spikes to activate the transistor switch and directs negative induced voltage spikes to activate the discharging means.

6. The switch-mode power converter of claim 4 wherein the driving capacitor is an internal capacitor of the transistor switch.

7. The switch-mode power converter of claim 4 wherein the primary capacitor has a capacitance value that is at least about 10 times greater than a capacitance value of the driving capacitor.

8. The switch-mode power converter of claim 7 wherein the primary capacitor has a capacitance value of about 0.004 microFarads and the driving capacitor has a capacitance value of about 400 picoFarads.

9. The power supply of claim 4, wherein said driving capacitor consists of the inherent capacitor of the transistor switch.

10. The power supply of claim 1, wherein said driver does not comprise any field-effect transistors.

11. A switch-mode power converter comprising:
   a transistor switch; and
   a pulse transformer circuit for driving the transistor switch in response to a stream of switch control pulses, the pulse transformer circuit comprising:
      a transformer having a primary winding and a secondary winding;
      a primary capacitor;
      the switch control pulse source and the primary capacitor connected in series with the primary winding, wherein the primary capacitor is sized so that beginning at the leading edge of a switch control pulse, a positive voltage spike is applied across the primary winding inducing a positive voltage spike across the secondary winding, and, beginning at the trailing edge of a switch control pulse, a negative voltage spike is applied across the primary winding inducing a negative voltage spike across the secondary winding; and
      a driver operatively connected to the secondary winding and the transistor switch for driving the transistor switch, the driver activating the transistor switch in response to the induced positive voltage spike across the secondary winding and discharging the transistor switch in response to the induced negative voltage spike across the secondary winding;

wherein the driver comprises an S-R latch having an output operatively connected to the transistor switch, a set input connected so that the latch output goes high in response to the induced positive voltage spike, and a reset input connected so that the latch output goes low in response to the induced negative voltage spike, and wherein the transistor switch is on during the high latch output.

12. The switch-mode power converter of claim 11 wherein the S-R latch is a CMOS device that is powered by a stable, outside voltage-regulated source.

13. The switch-mode power converter of claim 11 wherein the transistor switch is a MOSFET device.

14. The switch-mode power converter of claim 13 wherein the S-R latch is a low-power CMOS device whose power is derived from the switch control pulses.

15. A switch-mode power converter comprising:

a transistor switch; and a pulse transformer circuit for driving the transistor switch in response to a stream of switch control pulses, the pulse transformer circuit comprising:

a transformer having a primary winding and a secondary winding;

a primary capacitor;

the switch control pulse source and the primary capacitor connected in series with the primary winding, wherein the primary capacitor is sized so that beginning at the leading edge of a switch control pulse, a positive voltage spike is applied across the primary winding inducing a positive voltage spike across the secondary winding, and, beginning at the trailing edge of a switch control pulse, a negative voltage spike is applied across the primary winding inducing a negative voltage spike across the secondary winding; and a driver operatively connected to the secondary winding and the transistor switch for driving the transistor switch, the driver activating the transistor switch in response to the induced positive voltage spike across the secondary winding and discharging the transistor switch through a bipolar discharging transistor in response to the induced negative voltage spike across the secondary winding;

wherein said bipolar discharging transistor has collector and emitter leads operatively connected to the driving capacitor, the discharging transistor further having a base lead connected so that it is biased by the induced negative voltage spike, wherein when the base lead is biased, the charge on the driving capacitor is discharged through the discharging transistor.

16. A switch-mode power converter for generating a voltage-regulated output to a load, comprising:

a transformer having a secondary winding, and a primary winding for connection to an unregulated input voltage source;

a switch control pulse source connected to generate pulses, each pulse having a leading edge and a trailing edge;

a MOSFET switch in series connection with the secondary transformer winding and the load; and a pulse transformer circuit for driving the MOSFET switch in response to pulses generated by the switch control pulse source, the pulse transformer circuit comprising:

a pulse transformer having a pulse transformer primary winding and a pulse transformer secondary winding;

a primary capacitor;

the switch control pulse source and the primary capacitor connected in series with the pulse transformer primary winding, wherein the primary capacitor is sized so that beginning at the leading edge of a switch control pulse, a positive voltage spike is applied across the pulse transformer primary winding inducing a positive voltage spike across the pulse transformer secondary winding, and, beginning at the trailing edge of a switch control pulse, a negative voltage spike is applied across the pulse transformer primary winding inducing a negative voltage spike across the pulse transformer secondary winding; and a driver operatively connected to the pulse transformer secondary winding and the MOSFET switch for driving the MOSFET switch, the driver activating the MOSFET switch in response to the induced positive voltage spike across the pulse transformer secondary winding and discharging the MOSFET switch through a bipolar discharging transistor in response to the induced negative voltage spike across the pulse transformer secondary winding.

17. The switch-mode power converter of claim 16 wherein an internal diode of the MOSFET switch is oriented to provide active rectification in the flyback converter.

18. A computer comprising:

a system board with a central processing unit that operates at a regulated voltage level;

a display device in communication with the system board;

an input device in communication with the system board and that operates at a regulated voltage level; and a power supply for providing voltage-regulated power to the system board and the input device, the power supply comprising a switch-mode power converter having a transistor switch driven by a pulse transformer circuit, the transistor switch being driven in response to a stream of switch control pulses, each pulse having a leading edge and a trailing edge, the pulse transformer circuit comprising:

a transformer having a primary winding and a secondary winding;

a primary capacitor;

the switch control pulse source and the primary capacitor connected in series with the primary winding, wherein the primary capacitor is sized so that beginning at the leading edge of a switch control pulse, a positive voltage spike is applied across the primary winding inducing a positive voltage spike across the secondary winding, and, beginning at the trailing edge of a switch control pulse, a negative voltage spike is applied across the primary winding inducing a negative voltage spike across the secondary winding; and a driver operatively connected to the secondary winding and the transistor switch, the driver activating the transistor switch in response to the induced positive voltage spike across the secondary winding and discharging the transistor switch through a bipolar discharging transistor in response to the induced negative voltage spike across the secondary winding.

19. The computer of claim 18, wherein:

the computer is a portable computer; and the power supply further provides voltage-regulated power to the display device.

20. The power supply of claim 18, wherein said driver does not comprise any field-effect transistors.

* * * * *